US005194742A

United States Patent [19]

Avnery et al.

[11] Patent Number: 5,194,742

[45] Date of Patent: Mar. 16, 1993

[54] METHOD OF AND APPARATUS FOR SHIELDING ELECTRON AND OTHER PARTICLE BEAM ACCELERATORS

[75] Inventors: Tzvi Avnery, Winchester; Michael R. Fishel, Canton, both of Mass.

[73] Assignee: Energy Sciences Inc., Wilmington, Mass.

[21] Appl. No.: 823,672

[22] Filed: Jan. 21, 1992

[51] Int. Cl.[5] .......... H01J 37/30; G21F 7/00

[52] U.S. Cl. .......... 250/492.3; 250/515.1

[58] Field of Search .......... 250/492.3, 515.1, 517.1

[56] References Cited

U.S. PATENT DOCUMENTS

| | | | |
|---|---|---|---|
| 2,521,445 | 9/1950 | Brown | 15/119 |
| 3,433,947 | 3/1969 | Emanuelson et al. | 250/492.3 |
| 3,676,673 | 7/1972 | Coleman | 250/492.3 |
| 3,702,412 | 11/1972 | Quintal | 313/299 |
| 4,252,413 | 2/1981 | Nablo | 250/310 |
| 4,286,166 | 8/1981 | Glukhikh et al. | 250/492.3 |
| 4,446,374 | 5/1984 | Ivanas et al. | 250/492.3 |
| 4,521,445 | 6/1985 | Nablo et al. | 250/492.3 |
| 4,631,444 | 12/1986 | Cheeser | 250/492.3 |
| 4,642,244 | 2/1987 | Tripp, III et al. | 427/44 |
| 4,652,763 | 3/1987 | Nablo et al. | 250/492.3 |

*Primary Examiner*—Bruce C. Anderson
*Attorney, Agent, or Firm*—Rines and Rines; Shapiro and Shapiro

[57] ABSTRACT

A novel technique and apparatus for shielding electron beam and similar product irradiation zones with a separable shielding housing extending transversely of the longitudinal line of product flow and slidably openable in a transverse direction orthogonal to both the electron beam and the direction of product flow, both in passing the beam and along the line, resulting in substantial space saving, more facile accelerating to the irradiation and product feed zone and less costly and sizeable shielding apparatus.

17 Claims, 4 Drawing Sheets

METHOD OF AND APPARATUS FOR SHIELDING ELECTRON AND OTHER PARTICLE BEAM ACCELERATORS

The present invention relates to methods of and apparatus for shielding the regions of irradiation of materials by electron beam and other beam accelerators and the like, including radiation treatment of moving webs or moving discrete materials or surfaces or coatings thereon, or materials carried thereby to be processed, all hereinafter referred to variously as surfaces, sheet material, or even more generally as product.

BACKGROUND

Considering first and principally the illustrative and important field of electron beam accelerators, the art has been properly vitally concerned with providing practical and affordable shielding safety in diverse production line and other environments where electron-beam irradiation is to be employed. One of the major barriers to the widespread industrial use of energetic electrons (energies>20 keV in such applications, for example) as for the completion of polymerization in free radical cured systems, for the cross-linking or degradation of various natural and synthetic polymers, and/or for the surface and bulk sterilization of materials, indeed, has been the difficulty residing in the safe introduction of the product to the electron processor or irradiator in a continuous manner, usually at high production-line speeds (e.g. from 30 m/minute to 500 m/minute).

This problem arises from the nature of the energy source. When energetic electrons ultimately stop in material, the relatively unpenetrating particle (electron), as it slows down, dissipates some of its energy in the form of penetrating photons (bremsstrahlung), and causes the excitation of characteristic X-rays from the atoms of the material with which it interacts. The resultant source of penetrating X-ray or photon radiation is difficult to confine due to its great penetrability in solid matter. As a consequence, on-line continuous application of electron curing has been difficult and in some cases has seemed impracticable. Processes which have been developed for wire and cable, polyethylene cross-linking and surface coating curing applications, have been accomplished with vault or volume shielding of the entire system—an approach quite incompatible with most high-speed line-curing requirements.

A breakthrough in successful practical shielding in some industrial applications of electron beam irradiation is described in U.S. Pat. Nos. 4,252,413 and 4,642,244 of the assignee of the present invention; wherein irradiation zones are protected by in-line longitudinally extending housings that, though receiving and passing the surfaces such as webs and other materials, trap the dangerous radiation and side effects to insure safety on the line. An example of the use of such apparatus is the Energy Sciences "Selfshield" type CB/175/105/760 electron beam processor.

The shielding housing also has provision for receiving inert gases, such as nitrogen, in the irradiation zone where the surface-to-be-irradiated is passed by the electron beam accelerator window. For assembly, adjustment and maintenance, the lower half of the longitudinally extending in-line housing is generally moved or opened downward to permit access to the irradiation zone and surface or web or product feed systems.

If the accelerator and its window are not oriented horizontally, but are displaced at an acute angle, the lower half of the longitudinally extending shielding-housing is moved away longitudinally and downwardly for access.

Similarly, where drum type irradiation curing systems are used, as for example, in U.S. Pat. No. 4,521,445 of said assignee, the drum may be incorporated as part of the longitudinally extending shielding housing, again with its lower section downwardly movable to give access to the irradiation and product feedthrough zone.

It has now been discovered, however, that considerable space can be saved and far better and more convenient access to the irradiation and surface feed zones attained, as well as improved shielding efficacy and at lower cost, through a rather radical change of shielding housing design, wherein the construction is transverse or lateral to the sheet material or other surface handling line, and the shielding housing is formed to provide a novel transverse or lateral sliding separation of housing halves, to open and close the irradiation and feed zones.

OBJECTS OF INVENTION

It is thus an object of the present invention to provide a new and improved method of and apparatus for shielding inert-zone electron irradiation and the like, that enables significantly improved serviceability, reduces process line space requirements, and enables the use of considerably smaller shielding apparatus.

Other and further objects will be explained hereinafter and are more particularly pointed out in the appended claims.

SUMMARY

In summary, the invention embraces an electron beam shielding housing for passing therethrough a moving surface-to-be-irradiated within the housing by electrons passed through a planar window into an irradiating zone defined within the housing. The housing comprises stationary and movable halves defining said zone and each of generally zig-zag cross-section, with the intermediate wall portions thereof extending in parallel spaced planes normal to a first direction of passage of the electrons through the window. The housing halves, when in closed position, form surface inlet and outlet passages on the opposite legs of the zig-zag cross-section extending substantially parallel to the first direction, and enclose surface moving rolls adjacent said passages for carrying the surface into the inlet passage, over and between the rolls along a plane parallel to said window and along a second direction normal to said first direction, and out the outlet passage, moving oppositely to said first direction. Means is provided for sliding the movable housing half along a third direction orthogonal to both the first and second directions and relative to the stationary housing half, with constant space separation between the halves, to open and close said zone.

From another point of view, the invention is concerned with a method of shielding the irradiation of the sheet material in said zone and permitting maintenance and adjustment thereof with minimum space and height requirements in the line, said method comprising, enclosing the window and the zone, through which the sheet material passes by the window, in a shielding housing extending transversely of the line; dividing the housing into a stationary half and a moving half, slideable transversely of the line relative to the stationary half; passing the sheet material longitudinally into and out of the housing on opposide sides of the window and intermediately across the window zone; and sliding the slideable housing half transversely relative to the stationary half to open and close the housing, with the sheet material remaining within the stationary housing half.

Best mode and preferred design features and advantages are later more fully explained.

DRAWINGS

The invention will now be described in connection with the accompanying drawings, FIG. 1 of which is an isometric view of the invention in preferred form, illustrated as applied to an electron beam accelerator, and showing the shielding housing in the closed position;

Figure 1:
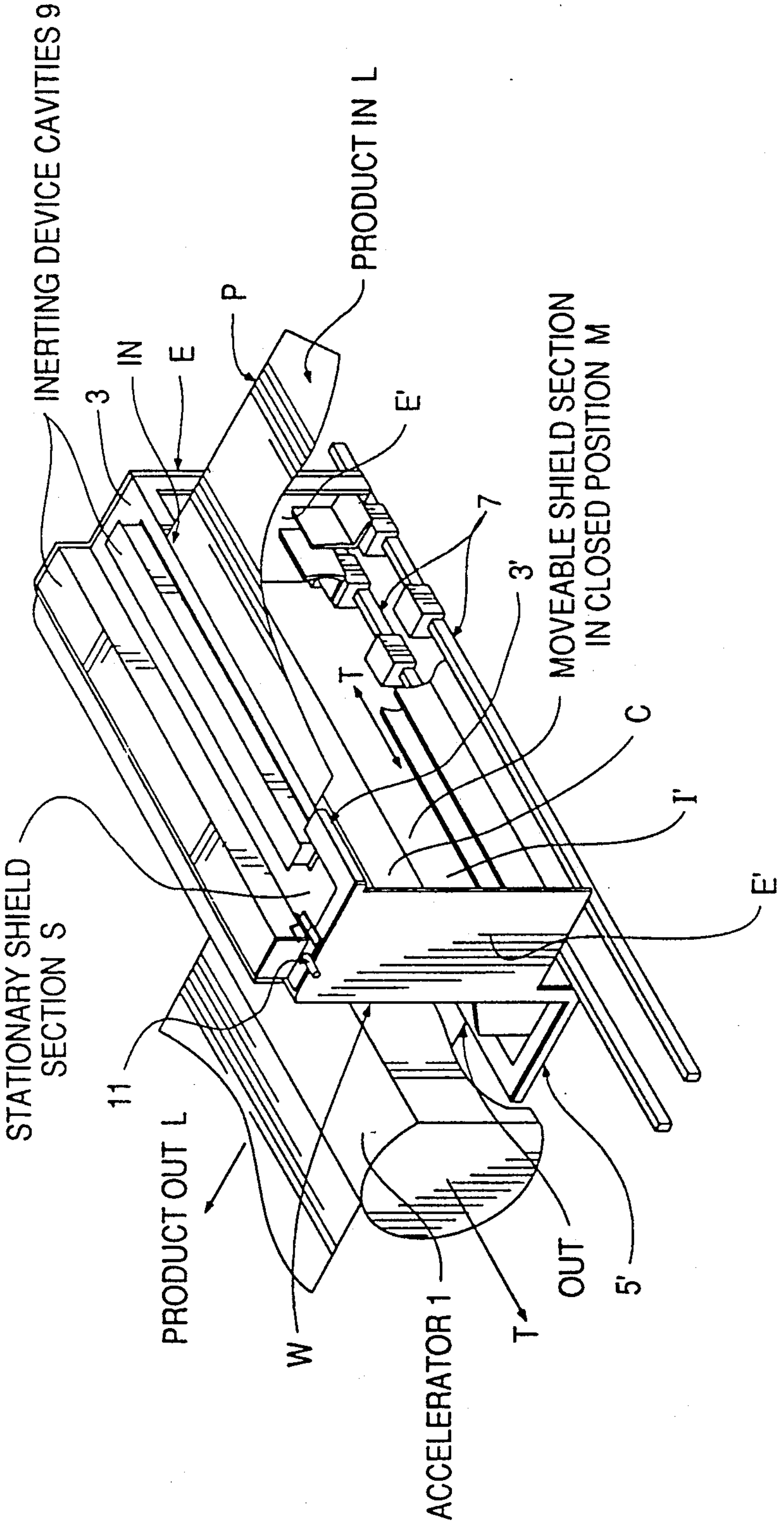
Figure 2:
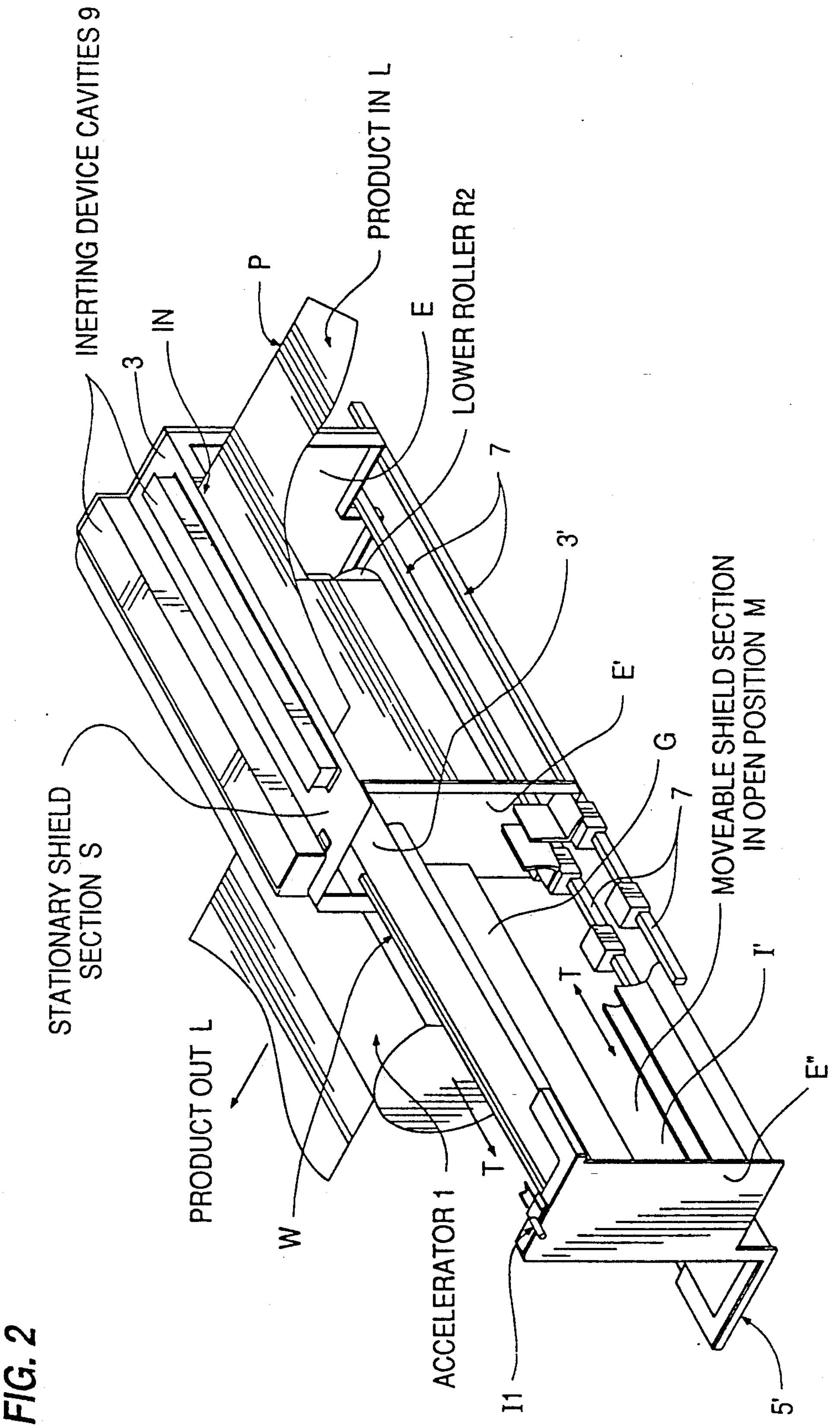
FIG. 2 is a similar view in the open position.

Referring to FIGS. 1 and 2, an electron beam accelerator is shown generally at 1, as of the type, for example, described in U.S. Pat. No. 3,702,412 of said assignee, and marketed as the before-mentioned series CB/175 of Energy Sciences Inc. The accelerator 1 is mounted transversely along a transverse axis T with its window-carrying surface W shown in a vertical plane abutting a corresponding intermediate vertical planar wall I (FIG. 3) of a stationary shielding housing section half S of the invention. As more particularly shown in FIG. 3, the stationary half S of the shielding housing, as of the shielding materials fully described in said U.S. Pat. Nos. 4,252,413 and 4,642,244, is of somewhat zig-zag cross-sectional construction, with the intermediate (front or left) wall I exposing the planar electron beam window W to the internal irradiation zone Z bounded by the housing.

The electron beam is shown entering zone Z in the horizontal direction H opposite to the line of passage or movement of the sheet material or other surface or product P entering the housing longitudinally along the line L at an inlet IN at the upper leg wall 3 of the stationary housing section half S, and exiting along the longitudinal direction L at the lower outlet OUT at the lower wall 5, with the inlet and outlet vertically staggered or spaced so that there is no line-of-sight path through the shielding housing to allow the escape of radiation by-products.

The sheet material P or other moving surface-to-be-treated is conveyed through the housing irradiation zone Z by respective input and output rollers $R_1$ and $R_2$ mounted within the stationary housing section half S near the respective inlet IN and outlet OUT. The surface P, in passing over and between rollers $R_1$ and $R_2$, is carried in a vertical direction downwardly in a plane parallel to the housing wall I and the window W, orthogonal or normal to the horizontal direction H of the electron beam, and the surface is irradiated thereby in passing across the window W.

Cooperative with the stationary shielding housing section half S, is a generally corresponding zig-zag cross-section mating movable housing section half M. the upper leg wall 3' of which, in closed position, forms the inlet IN with the stationary section upper wall 3; and the lower wall 5' of which similarly cooperates with the lower wall 5 of the stationary section half S to define the outlet OUT. The intermediate vertical wall I' is parallel to the stationary section wall I and carries a beam collection plate C, as of the type described in said patents, in the region opposite the window W on the other (right or back) side of the surface P, to stop the unspent electrons. The mated section halves S and M thus close off the radiation zone Z and permit safe treatment of the product in FIGS. 1 and 3.

In accordance with the invention, therefore, the shielding housing does not extend longitudinally along the production line as in said patents, but occupies much more limited space transversely of the line. It also does not require vertical or downward opening as in the prior art, as before explained, since the movable section M slides laterally or transversely, as on slide rails 7, to the open position of FIG. 2, in the direction T orthogonal to both the longitudinal direction H of the electron beam and the vertical direction of the plane of the surface-to-be-irradiated and the window W.

Figure 3:
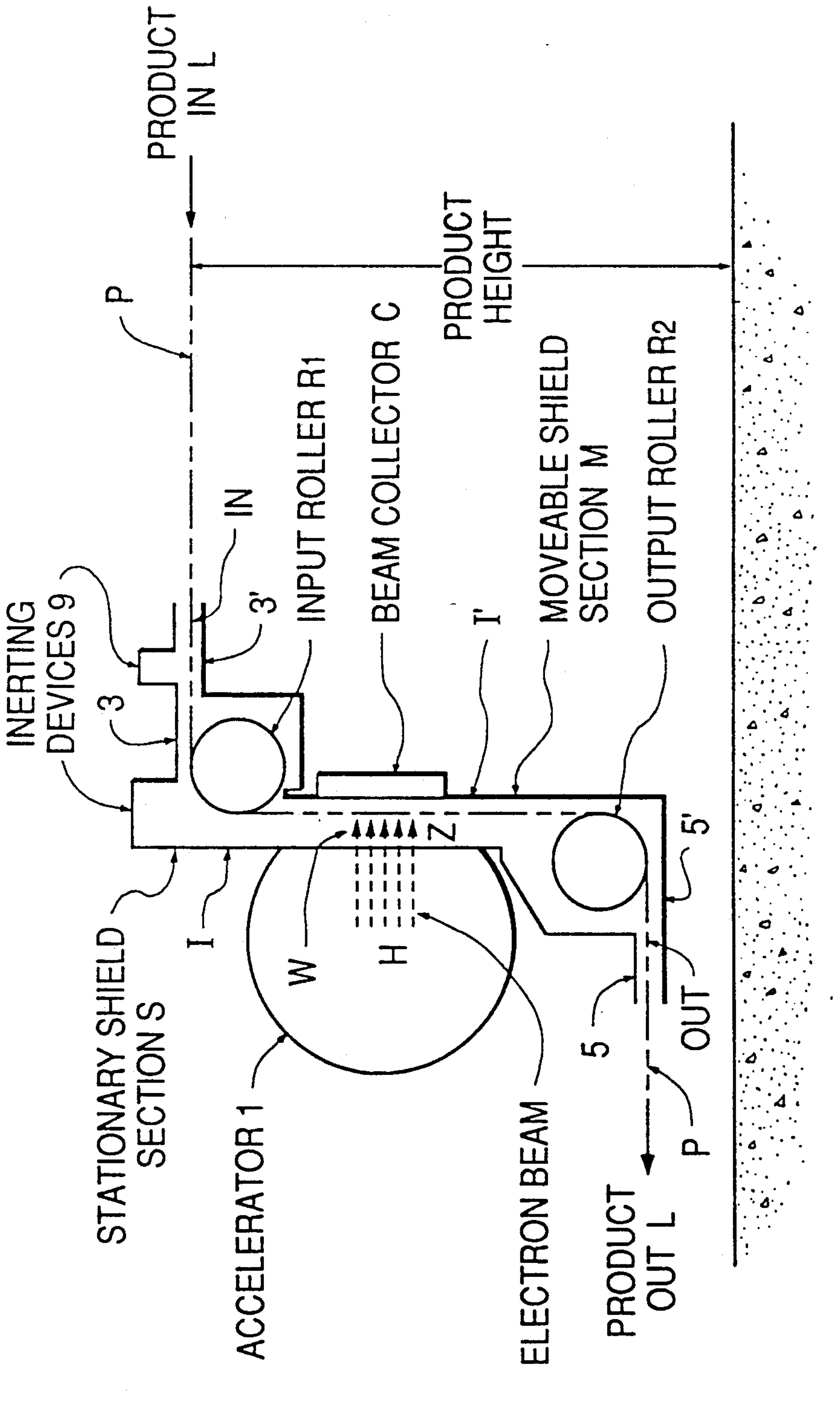
FIG. 3 is a cross-sectional view of the accelerator shown in FIGS. 1 and 2.

Inerting, as with nitrogen gas, is readily effected by forming the upper wall S into cavities 9 that receive the gas when the assembly is in the closed operating position of FIGS. 1 and 3. As more particularly shown in FIG. 3, limited height between rolls $R_1$ and $R_2$ (so-called product height) is achievable; and, as is more evident from FIG. 2, extremely facile access is provided to the product feed and irradiation zone for set-up, adjustment and maintenance than with prior art systems.

In the construction shown, the stationary section S has a right-hand end wall E but is open at the other end where it receives the movable section M, which has an end wall E' that abuts the wall E in closed position, and an outer (left-hand) end wall E'' that seals off the housing in closed position (FIG. 1). The housing is locked and released as at 11 in the transverse direction T, again as contrasted with prior art vertical locking mechanisms. The movable self-shielding structure M thus slides in a direction perpendicular both to the particle beam and the moving direction of the product, while the orthogonal (longitudinal) separation distance between the stationary and the movable sections remains constant.

Recapitulating, among benefits of this invention are the following:

1. Saving of production line space

As production lines get more complex due to the desire to start with raw materials in the beginning of the line and achieve a finished product at the end of the line, the production lines get larger and longer. Saving space in the length of the production line is, therefore, becoming more critical.

Figure 4:
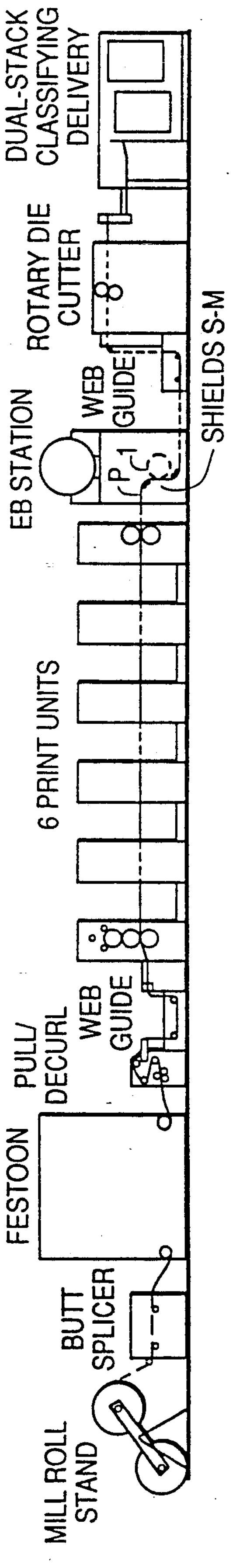
FIG. 4 is a side elevation of a typical production line in the printing industry, showing the limited space requirements afforded by the invention.

An example of such a production line, as in the printing industry, is shown in FIG. 4. A raw material web starts at the beginning of the line, followed by an accumulator to allow for automatic splicing of the raw material entering from a spool. Typically, this is followed by a six color printing press, an overcoat station, the electron beam accelerator ("dryer") and shielding of the present invention, an in-line cutter, and then the stacker. At the end of the line, the boxes are ready to be loaded for shipment. Obviously, in between all of the above stations, there is QC equipment, not shown.

Some applications, such as crosslinking, sometimes in-line with the extruder, also require a minimum production line length for technical superiority. The manufacturer can produce a better product because the stations are closer to one another and, therefore, there is better control.

2. The movable shielding can move to the service isle. This makes servicing and threading more convenient and more efficient.

3. In the configuration of the invention, it is assured that the production line stays intact and uninterrupted irrespective of the position of the shield. This allows the customer to align, inspect, run and observe the mechanical operation of the production line even when the shield is open.

Further modifications will occur to those skilled in this art and such are considered to fall within the spirit and scope of the invention as defined in the appended claims.

What is claimed is:

1. In an electron beam accelerator having a substantially planar window through which electrons are passed in a first direction normal to the plane of the window to impinge upon a surface-to-be-irradiated moved in a zone past the window in a plane parallel thereto and extending in a second direction normal to the first direction, apparatus for shielding the zone having, in combination, a stationary half of a housing of shielding material of generally zig-zag cross-sectional configuration extending along a third direction orthogonal to both the first and second directions and having an intermediate substantially planar wall portion exposing the window to the zone and enveloping surface-moving inlet and outlet rolls on opposite sides of the window to move the surface through the zone across the window in said plane; a second half of a housing of shielding material of generally mating zig-zag cross-sectional configuration closing off said zone with its intermediate substantially planar portion carrying a beam collector surface on the opposite side of said surface from the window and enclosing said rolls to provide staggered surface inlet and outlet passages, each extending substantially parallel to said first direction; and means for enabling sliding of the second housing half along said third direction to open the said zone while maintaining a constant zone separation distance in the first direction between the first and second housing halves, including with the surface in place, and to permit sliding back to zone-closing position to enable open access to said zone.

2. Apparatus as claimed in claim 1 and in which there is provided means for locking and unlocking the housing halves along said third direction.

3. Apparatus as claimed in claim 1 and in which the wall of the stationary housing half forming the inlet passage forms cavity means extending along said third direction.

4. Apparatus as claimed in claim 3 and in which means is provided for introducing nitrogen inerting gas within said zone through said cavity means when the housing halves are in the zone-closing position.

5. Apparatus as claimed in claim 1 and in which the stationary housing half is provided at one end with an end wall and is open at the other end to receive the second housing half that is slideable along said third direction to closed and open zone positions with respect thereto, the second housing half having end walls, one of which abuts the stationary housing half end wall in the closed position and the other end wall of which closes off the open end of the stationary housing half in such closed position.

6. Apparatus as claimed in claim 1 and in which the electron beam accelerator with its window is positioned along said third direction exteriorly abutting the said intermediate wall portion of the stationary housing half.

7. Apparatus as claimed in claim 1 wherein the said surface is carried as a product web at first parallel to, though opposite to, the first direction into the inlet passage, over and between the rolls along said second direction and back parallel to, but opposite to, the first direction out of the outlet passage.

8. Apparatus as claimed in claim 7 and in which the said first direction extends longitudinally, with the surface-to-be-irradiated moving longitudinally oppositely to the first direction into the housing inlet and out of the housing outlet, and with the third direction extending transversely of the apparatus and the direction of surface movement.

9. Apparatus as claimed in claim 8 and in which the transverse third direction is oriented substantially horizontally and the second direction is oriented substantially vertically.

10. An electron beam shielding housing for passing therethrough a moving surface-to-be-irradiated within the housing by electrons passed through a planar window into an irradiating zone defined within the housing, the housing comprising stationary and movable shielding halves defining said zone and each of generally zig-zag cross-section, with the intermediate wall portions thereof extending in parallel spaced planes normal to a first direction of passage of the electrons through the window; the housing halves, when in closed position, forming surface inlet and outlet passages on the opposite legs of the zig-zag cross-section extending substantially parallel to the first direction and enclosing surface moving rolls adjacent said passages for carrying the surface into the inlet passage, over and between the rolls along a plane parallel to said window and along a second direction normal to said first direction, and out the outlet passage, moving oppositely to said first direction; and means for sliding the movable housing half along a third direction orthogonal to both the first and second directions and relative to the stationary housing half, with constant space separation between the halves, to open and close said zone.

11. An electron beam shielding housing as claimed in claim 10 and in which the leg of the stationary housing half forming the inlet passage is provided with cavity means extending along said third direction.

12. An electron beam shielding housing as claimed in claim 11 and in which means is provided for introducing inerting gas through said cavity means into said zone when the housing halves are in closed position.

13. An electron beam shielding housing as claimed in claim 10 and in which the stationary housing half is provided at one end with an end wall and is open at the other end to receive the second housing half that is slideable along said third direction to closed and open zone positions with respect thereto, the second housing half having end walls, one of which abuts the stationary housing half end wall in the closed position and the other end wall of which closes off the open end of the stationary housing half in such closed position.

14. In a sheet material handling line including an electron beam irradiating station having an electron beam accelerator for irradiating the sheet material as it passes an electron beam transmitting window zone and proceeds longitudinally along the line, a method of shielding the irradiation of the sheet material in said zone and permitting maintenance and adjustment thereof with minimum space and height requirements in the line, said method comprising, enclosing the window and the zone, through which the sheet material passes by the window, in a shielding housing extending transversely of the line; dividing the housing into a stationary half and a moving half, slideable transversely of the line relative to the stationary half; passing the sheet material longitudinally into and out of the housing on opposide sides of the window and intermediately across the window zone; and sliding the slideable housing half transversely relative to the stationary half to open and close the housing, with the sheet material remaining within the stationary housing half.

15. A method as claimed in claim 14 and in which the transverse sliding of the moving housing half is effected while maintaining the longitudinal separation of the housing halves constant.

16. A method as claimed in claim 14 and in which the housing halves are shaped in substantially zig-zag cross section, with the window abutting an intermediate wall portion of the stationary housing half, and the sheet material being fed longitudinally into upper and lower housing inlet passages and transversely downward along the intermediate wall portion therebetween.

17. A method as claimed in claim 16 and in which beam collecting is effected in the region of the movable housing half intermediate wall portion opposite the window after passage of the electrons from the window through the sheet material passing thereby.

* * * * *